United States Patent
Gang

(10) Patent No.: US 6,507,096 B2
(45) Date of Patent: Jan. 14, 2003

(54) TAPE HAVING IMPLANTABLE CONDUCTIVE LANDS FOR SEMICONDUCTOR PACKAGING PROCESS AND METHOD FOR MANUFACTURING THE SAME

(75) Inventor: Heung-su Gang, Seoul (KR)

(73) Assignee: Kostat Semiconductor Co., Ltd., Seoul (KR)

( * ) Notice: Subject to any disclaimer, the term of this patent is extended or adjusted under 35 U.S.C. 154(b) by 0 days.

(21) Appl. No.: 09/984,206

(22) Filed: Oct. 29, 2001

(65) Prior Publication Data

US 2002/0048948 A1 Apr. 25, 2002

Related U.S. Application Data

(62) Division of application No. 09/677,601, filed on Oct. 3, 2000.

(30) Foreign Application Priority Data

Aug. 9, 2000 (KR) .............................................. 00-46165

(51) Int. Cl.$^7$ ............................................... H01L 23/02
(52) U.S. Cl. ...................... 257/678; 257/707; 257/784; 438/110
(58) Field of Search ................................ 257/675, 678, 257/707, 784, 792; 438/110, 111

(56) References Cited

U.S. PATENT DOCUMENTS

| | | | |
|---|---|---|---|
| 5,200,362 A | | 4/1993 | Lin et al. |
| 6,245,594 B1 | * | 6/2001 | Wu et al. ................... 438/108 |
| 6,247,229 B1 | * | 6/2001 | Glenn .......................... 29/841 |
| 6,293,456 B1 | * | 9/2001 | MacKay et al. ............. 228/254 |
| 6,429,508 B1 | * | 8/2002 | Gang .......................... 257/676 |

FOREIGN PATENT DOCUMENTS

| | | |
|---|---|---|
| EP | 0 751 561 A1 | 1/1997 |
| WO | WO 97/39482 | 10/1997 |
| WO | WO 00/22668 | 4/2000 |

OTHER PUBLICATIONS

Harper, Electronic Packaging and Interconnection Handbook, McGraw–Hill, New York, 1997.*

* cited by examiner

Primary Examiner—Amir Zarabian
Assistant Examiner—Christian D. Wilson
(74) Attorney, Agent, or Firm—Rothwell, Figg, Ernst & Manbeck

(57) ABSTRACT

A tape having implantable conductive lands, which realizes a new structure in which an organic rigid substrate is removed from a semiconductor package in a semiconductor packaging process, and a method for manufacturing the tape are provided. The tape includes a tape film, which can be detached from a semiconductor package after an encapsulation process and serves as a general rigid substrate until the encapsulation process is completed, and implantable conductive lands adhering to the tape film. The tape having the implantable conductive lands may be manufactured by laminating a foil for the implantable conductive lands on the tape film and performing photolithography, by printing the implantable conductive lands on the tape film, by attaching the implantable conductive lands that are individually made in advance on the tape film and performing lamination, by depositing and patterning a material layer for the implantable conductive lands on the tape film, or by forming seed layers on the tape film and performing electroplating.

11 Claims, 10 Drawing Sheets

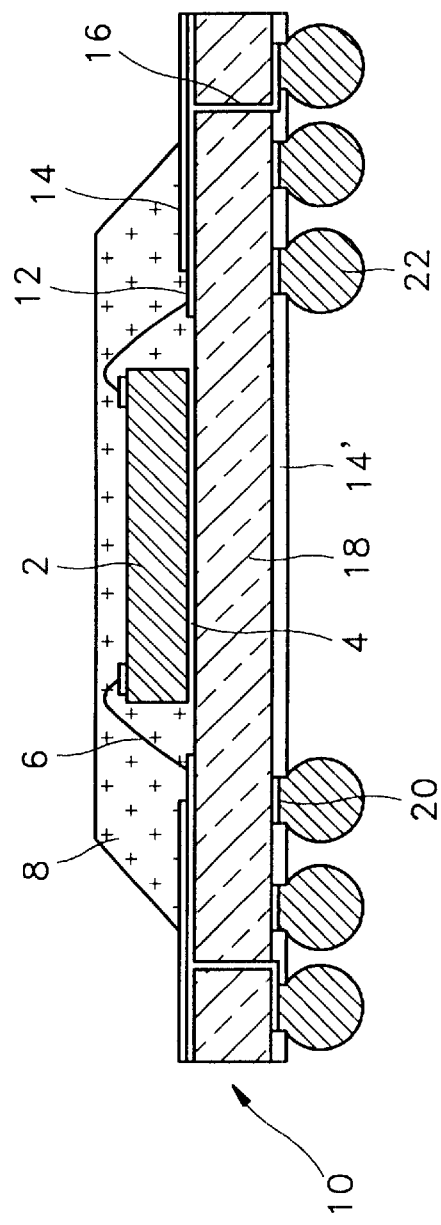
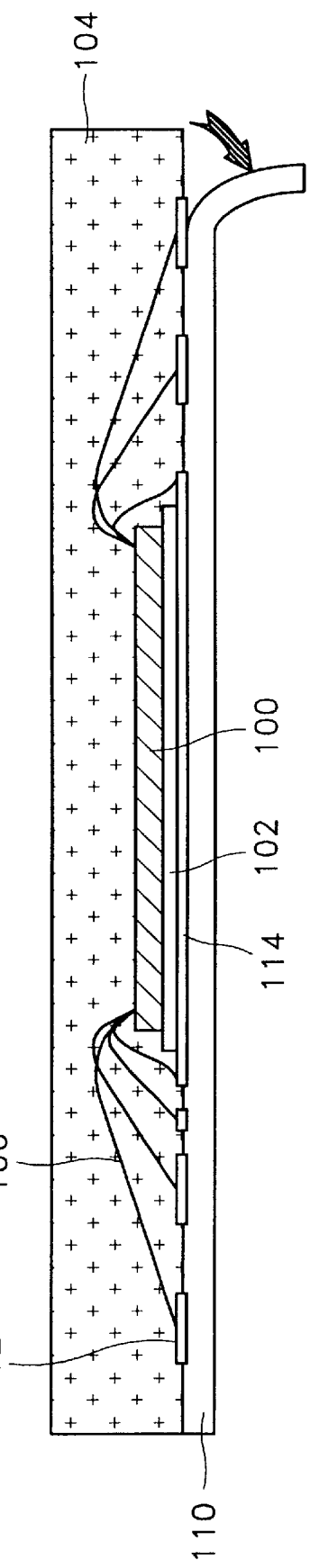

TAPE HAVING IMPLANTABLE CONDUCTIVE LANDS FOR SEMICONDUCTOR PACKAGING PROCESS AND METHOD FOR MANUFACTURING THE SAME

CROSS REFERENCE TO RELATED APPLICATION

This application is a division of application Ser. No. 09/677,601, filed Oct. 3, 2000.

BACKGROUND OF THE INVENTION

1. Field of the Invention

The present invention relates to assembly of a semiconductor package, and more particularly, to a tape having implantable conductive lands which is substituted for a rigid substrate during processes for manufacturing a semiconductor package such as a ball grid array (BGA) type package, and a method for manufacturing the same.

2. Description of the Related Art

Recently, electronic products such as personal computers, cellular phones and camcorders become smaller in size and larger in processing capacity. Accordingly, a semiconductor package which is small in size, large in capacity and compliant with a fast processing speed is fully required. Therefore, semiconductor packages have been transformed from an insertional mounting type including a dual in-line (DIP) package into a surface mounting type including a thin small out-line package (TSOP), a thin quad flat package (TQFP) and a ball grid array (BGA).

The BGA, among the surface mounting types, has attracted considerable attention since it allows the size and the weight of a semiconductor package to be greatly reduced and relatively high quality and reliability to be achieved among chip scale packages (CSPs).

Recently, most semiconductor manufacturing companies have developed CSPs and published developed CSPs by unique names. However, the structures of the CSPs are very similar to one another. A BGA type package is a sort of CSP. Every conventional BGA package uses a rigid substrate formed of, for example, polyimide, bismaleimide triazine (BT) resin or FR-4, instead of using a lead frames, as the body of a semiconductor package. Here, the FR-4 is a resin produced by hardening polymer referred to as dicyandiamide, generated as an intermediate of a melamine compound.

In the rigid substrate, circuit patterns are organically patterned on the front and rear surfaces of an insulation substrate such as polyimide. The circuit patterns are firmly stuck to the insulation substrate with a phenol-based two-side adhesive having an excellent adhesive strength, or a polyimide-based one-side adhesive. The rigid substrate has via-holes formed by piercing the insulation substrate for the interconnection between the circuit patterns, and also includes a solder mask formed of an insulation material for facilitating wire bonding, attachment of external connecting terminals and protection from external damage. Typical BGA packages use solder balls or solder bumps as external connecting terminals, instead of using leads.

Such a rigid substrate remains within a semiconductor package as a part thereof after completion of assembly of the semiconductor package, so it is an obstacle in minimizing the thickness of the semiconductor package. Once in a while, a rigid substrate is eliminated in assembling an improved semiconductor package among the CSPs. However, this case has many difficulties in performing wire bonding, encapsulation and attachment of external connecting terminals.

FIG. 1 is a sectional view of a typical BGA package using a rigid substrate instead of a lead frame. The structure of a conventional BGA package will be described focusing on the manufacturing processes thereof.

Referring to FIG. 1, a wafer is cut into individual chips in a sawing process, and thus a chip 2 is prepared for a BGA package. The chip 2 is bonded to a rigid substrate 10 with an epoxy 4 in a die attach process. Bond pads (not shown) of the chip 2 are connected to bond fingers on the rigid substrate 10 through gold wires 6 in a wire bonding process.

Here, circuit patterns 12 are organically formed on the rigid substrate 10. The circuit patterns 12 formed on the front surface of the rigid substrate 10 are connected to circuit patterns such as solder ball pads 20 formed on the rear surface of the rigid substrate 10 through via-holes 16. Solder masks 14 and 14' for protecting the circuit patterns 12 and for facilitating the attachment of solder balls, i.e., external connecting terminals, are formed on the front and rear surfaces, respectively, of the rigid substrate 10. An insulation substrate 18 constituting the inner portion of the rigid substrate 10 is formed of a BT resin or a plastic resin such as polyimide.

Subsequently, encapsulation for protecting the chip 2 and gold wires 6 provided on the front surface of the rigid substrate 19 is performed using an epoxy mold compound 8. Then, solder balls 22 which are external connecting terminals are attached to the solder pads 20 on the bottom of the rigid substrate 10. Finally, a strip of BGA packages is cut into individual BGA packages in a singluation process.

However, the rigid substrate used in a semiconductor packaging process according to the conventional technology has the following problems.

Firstly, intermediate connectors such as the circuit patterns 12 and 20 formed on the top and bottom of the rigid substrate 10 and via-holes 16 provided between the chip 2 and the external connecting terminals 22 degrade the electrical performance of a BGA package.

Secondarily, the insulation substrate 18 constituting the rigid substrate 10 remains within a BGA package after the completion of assembly of the BGA package, which limits the reduction of the thickness of a semiconductor package. In other words, there is a limitation in reducing the thickness of a semiconductor package.

Thirdly, since a process for forming the solder masks 14 and 14' is required to ensure the insulation between the circuit patterns 12, the manufacturing is complicated.

Finally, the rigid substrate 10 is very elaborate, so it is very difficult to manufacture it and its price is very high. Therefore, the cost for assembling a BGA package is high.

SUMMARY OF THE INVENTION

To solve the above problems, it is an object of the present invention to provide a tape having implantable conductive lands, which can be used instead of a rigid substrate during a semiconductor packaging process and does not remain within a semiconductor package after the assembly of the semiconductor package.

It is another object of the present invention to provide a method for manufacturing the tape having implantable conductive lands for a semiconductor packaging process.

Accordingly, to achieve the first object of the invention, there is provided a tape for a semiconductor packaging process, including a tape film which can be detached from a semiconductor package after an encapsulation process and serves as a lead frame or a substrate until the encapsulation process is completed, in manufacturing the semiconductor package; and implantable conductive lands adhering to the tape film and each having a first surface and a second surface facing each other, wherein the first surface is attached to the tape film and connected to an external connecting terminal of the semiconductor package, and the second surface adheres to an epoxy mold compound, and wire bonding is performed on the second surface.

The tape film includes a tape body in a lower portion and an adhesive layer formed on the tape body. A surface treatment layer is preferably formed on the second surface of each implantable conductive land.

The tape film is formed of a material which does not chemically react with other materials and is not transformed by heat and pressure during the manufacture of the semiconductor package. The tape film may be formed of polymer, paper, metal or a compound including at least one of them.

The adhesive layer may be formed of an adhesive such as a silicone-resin based adhesive facilitating detachment of the tape film from the implantable conductive lands.

The implantable conductive lands are preferably formed of copper or an alloy including copper, and the preferred surface treatment layer is a material layer allowing wire bonding.

To achieve the second object of the invention, there is provided a method for manufacturing a tape having implantable conductive lands for a semiconductor packaging process. The method includes the steps of preparing a tape film serving as a lead frame or a substrate until an encapsulation process is completed, the tape film not being contained within a semiconductor package; and forming the implantable conductive lands on the tape film.

The tape film includes a tape body and an adhesive layer, and the adhesive layer is formed of silicone resin-based paste.

In one embodiment, the step of forming the implantable conductive lands includes the sub-steps of laminating a copper foil on the tape film, forming a first photo mask pattern on the copper foil, performing surface treatment for wire bonding on opening areas of the first photo mask pattern, removing the first photo mask pattern and forming a second photo mask pattern, and performing an etching process using the second photo mask pattern so that only the implantable conductive lands can remain on the tape film.

In another embodiment, the step of forming the implantable conductive lands includes the sub-steps of printing the implantable conductive lands on the tape film, and performing surface treatment for wire bonding on the printed implantable conductive lands.

In still another embodiment, the step of forming the implantable conductive lands includes the sub-steps of picking and placing the implantable conductive lands that are made in the outside on the tape film in advance, and laminating the tape film and the implantable conductive lands.

In yet another embodiment, the step of forming the implantable conductive lands includes the steps of depositing a material layer for the implantable conductive lands on the tape film, and patterning the material layer.

In still yet another embodiment, the step of forming the implantable conductive lands includes the sub-steps of forming seed layers for the implantable conductive lands on the tape film, and performing electroplating using the seed layers.

According to the present invention, a tape having implantable conductive lands is used instead of using a rigid substrate, thereby improving the electrical performance of a semiconductor package and reducing the thickness of the semiconductor package. Since the expensive rigid substrate is not used, the manufacturing cost can be reduced, and easy and simplified manufacturing can be realized. Since the path of heat radiation is shortened, the heat conducting characteristics can be improved. Since an electric circuit can be kept short, the electrical characteristics can be improved. Also, a stress problem caused by different thermal expansive coefficients of a rigid substrate and the other parts in a semiconductor package can be restrained.

BRIEF DESCRIPTION OF THE DRAWINGS

The above objectives and advantages of the present invention will become, more apparent by describing in detail preferred embodiments thereof with reference to the attached drawings in which:

FIG. 1 is a sectional view of a typical ball grid array (BGA) package using a rigid substrate instead of a lead frame;

FIG. 2 is a sectional view of a BGA package using a tape having implantable conductive lands instead of a rigid substrate according to the present invention;

DETAILED DESCRIPTION OF THE PRESENT INVENTION

Preferred embodiments of the present invention will be described in detail with reference to the attached drawings. In this specification, the term semiconductor package is used in the most general sense and is not restricted to a particular semiconductor package such as a ball grid array (BGA). Also, a tape having implantable conductive lands is not limited to a particular shape.

The spirit and essential features of the present invention can be realized in different ways than those described in the preferred embodiments set forth below. For example, in the preferred embodiments of this specification, an adhesive layer is formed of a silicone-based adhesive, but any material which is not transformed due to thermal and chemical reaction during assembly of a semiconductor package and allows implantable conductive lands to be easily detached from a tape body can be used. In addition, a tape body is formed of polyimide in the preferred embodiments, but any material which is not transformed due to thermal and chemical reaction during assembly of a semiconductor package can be used. Also, a surface treatment layer is formed on one side of an implantable conductive land, but it may not be formed if wire bonding is possible without it. Therefore, the preferred embodiments will be disclosed in descriptive sense only and not for the purpose of limitation.

Application of a Tape Having Implantable Conductive Lands during a Semiconductor Packaging Process According to the Present Invention A tape having implantable conductive lands for a semiconductor packaging process is applied to the assembly of a semiconductor package in a completely different way than in applying a conventional rigid substrate. How the tape having implantable conductive lands is applied to the assembly of a semiconductor package will be described first with reference to FIGS. 2 and 3.

Figure 3:
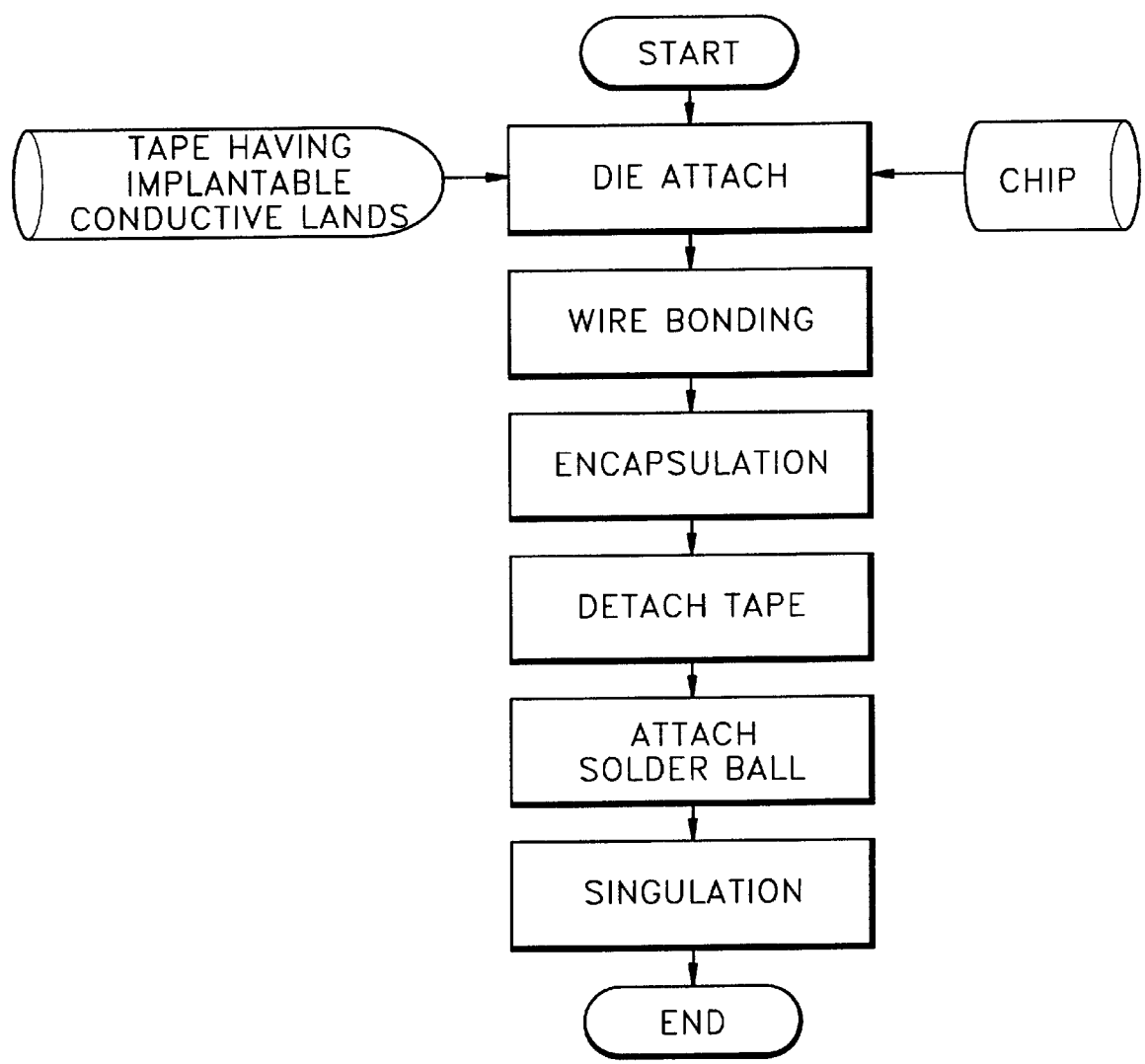
FIG. 3 is a flowchart illustrating the processes of manufacturing a semiconductor package using a tape having implantable conductive lands according to the present invention.

FIG. 2 is a sectional view of a ball grid array (BGA) package using a tape having implantable conductive lands instead of a rigid substrate according to the present invention. FIG. 3 is a flowchart illustrating the processes of manufacturing a semiconductor package using a tape having implantable conductive lands according to the present invention.

The structure of a semiconductor package, for example, a BGA package, according to the present invention will be described focusing on the processes for assembling the semiconductor package. In a die attach process, a chip 100 is attached to a tape film 110 having implantable conductive lands thereon using an epoxy 102. The implantable conductive lands are composed of an implantable conductive land 114 serving as a heat sink and implantable conductive lands 112 for connection of external connecting terminals.

In a wire bonding process, bond pads (not shown) of the chip 100 are connected to the implantable conductive lands 112 and 114 through gold wires 106. Here, a surface treatment for the wire bonding is preferably performed on a second surface of each of the implantable conductive lands 112 and 114 opposite to a first surface thereof on which the tape film 110 is attached. For the surface treatment, a surface treatment layer is formed using a single layer of gold, silver or palladium or a compound thereof to facilitate the wire bonding process.

After the completion of the wire bonding, the resultant structure is encapsulated using an epoxy mold compound 104. Here, the second surfaces of the implantable conductive lands 112 and 114 are adhered to the epoxy mold compound 104. Since an adhesive layer (132 of FIG. 8) which allows easy detachment is included in the tape film 110, the tape film 110 can be detached in the direction of the arrow and removed from the semiconductor package after the completion of the encapsulation.

As a result, the first surfaces of the implantable conductive lands 112 and 114 are exposed. Solder balls which are external connecting terminals may be attached to the first surfaces. Generally, assembly of semiconductor packages is not performed individually but in a strip units, so a singulation process of dividing a strip into individual BGA packages is finally performed.

Accordingly, a tape having implantable conductive lands for a semiconductor packaging process serves as a rigid substrate until an encapsulation process, and can then be removed so that the tape can be applied to the assembly of semiconductor packages. The use of the tape is a completely different concept than those of a conventional rigid substrate.

Figure 4:
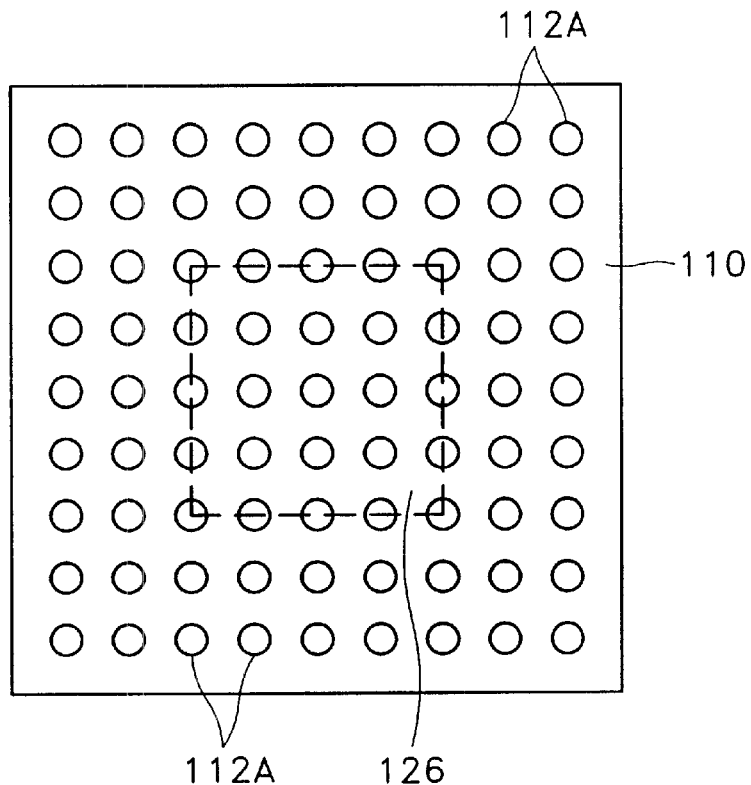
FIGS. 4 and 5 are plan views of tapes having implantable conductive lands according to the present invention.
Figure 5:
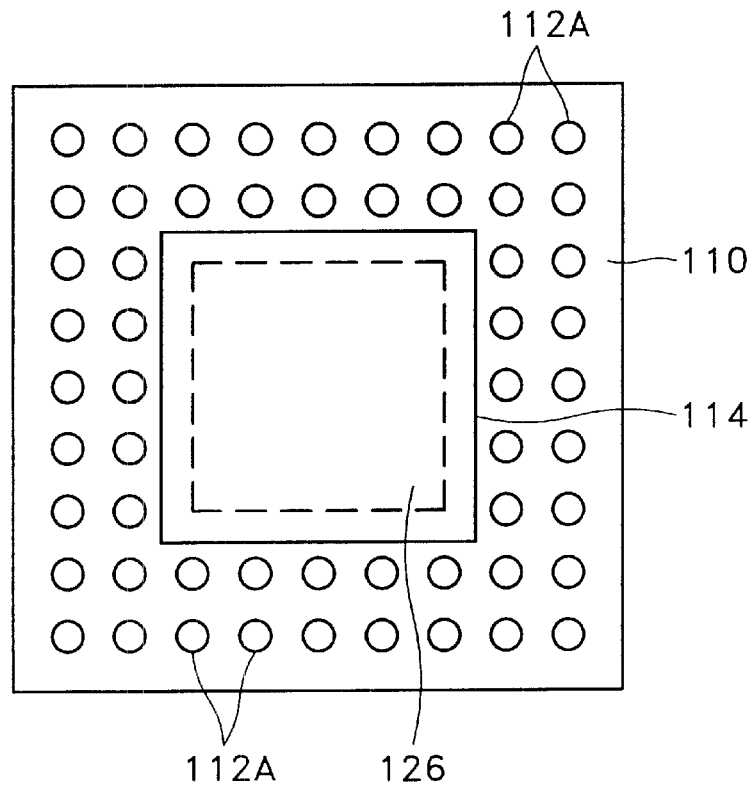

Structure of a Tape Having Implantable Conductive Lands for a Semiconductor Packaging Process according to the Present Invention FIGS. 4 and 5 are plan views of tapes having implantable conductive lands according to the present invention. Referring to FIG. 4, a tape having implantable conductive lands for a semiconductor packaging process according to the present invention includes a tape film 110 and implantable conductive lands 112A. The purpose of the tape film 110 is to serve as a conventional rigid substrate during a die attach process, a wire bonding process and an encapsulation process, and is detached from a semiconductor package after the encapsulation process. For this purpose, the tape film 110 includes an adhesive layer (not shown), which is easily detachable, on the surface thereof. Such an adhesive layer is conceptually different from a phenol adhesive or a polyimide-based adhesive used with a conventional rigid substrate. Conventionally, an adhesive is formed to have a great adhesive strength to prevent circuit patterns from being detached from an insulation substrate. However, an adhesive layer used in the present invention is formed of a silicone-based material which can be easily detached and does not leave residue.

For the circle-shape implantable conductive lands 112A, external connecting terminals may be attached to first surfaces adhering to the tape film 110, and second surfaces are used for wire bonding as in the conventional technology. The present invention has only implantable conductive lands without having circuit patterns used with a conventional rigid substrate. Moreover, the present invention does not need via-holes serving as intermediate connectors between bond pads of a chip and external connecting terminals.

In the drawing, reference numeral 126 denotes an area where a chip is attached. Here, the circle-shape implantable conductive lands 112A include implantable conductive lands used as heat sinks through which heat is radiated outward, and implantable conductive lands for connection of external connecting terminals.

Unlike FIG. 4, in which the implantable conductive lands used as heat sinks and the implantable conductive lands for connection of external connecting terminals are formed to have the same structure, in the embodiment of FIG. 5, a single implantable conductive land 114 for a heat sink which is larger than the total area of the heat sinks of FIG. 4 and has a different shape than the implantable conductive lands 112A for connection of an external connecting terminal is formed, thereby improving the heat conductivity. Since the contact area between the rear surface of a chip and the implantable conductive land 114 used as a heat sink is larger where the chip is attached, heat radiated from the chip can be more effectively removed from the semiconductor package.

Figure 6:
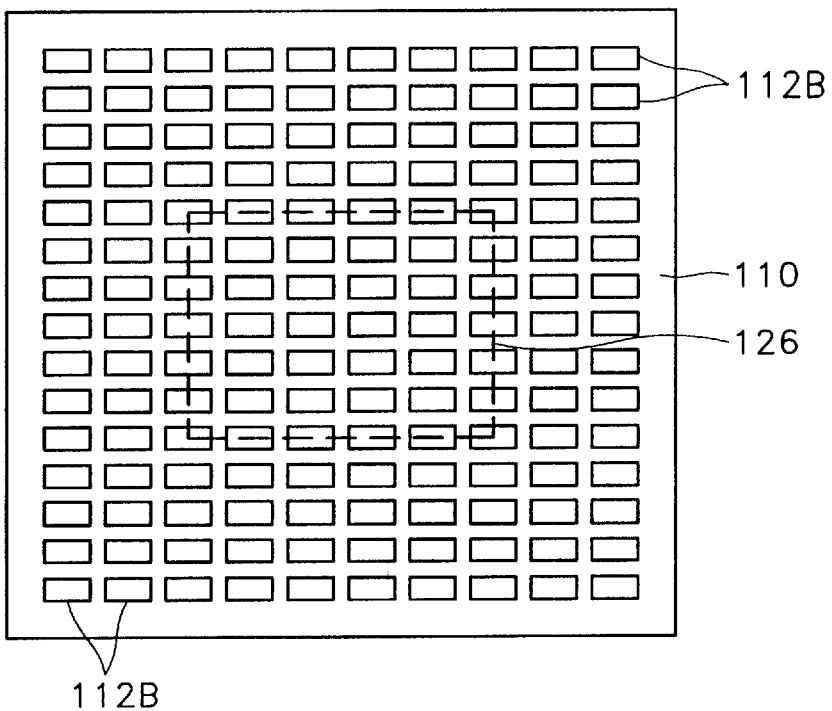
FIGS. 6 and 7 are plan views of tapes having implantable conductive lands having a modified shape according to the present invention.
Figure 7:
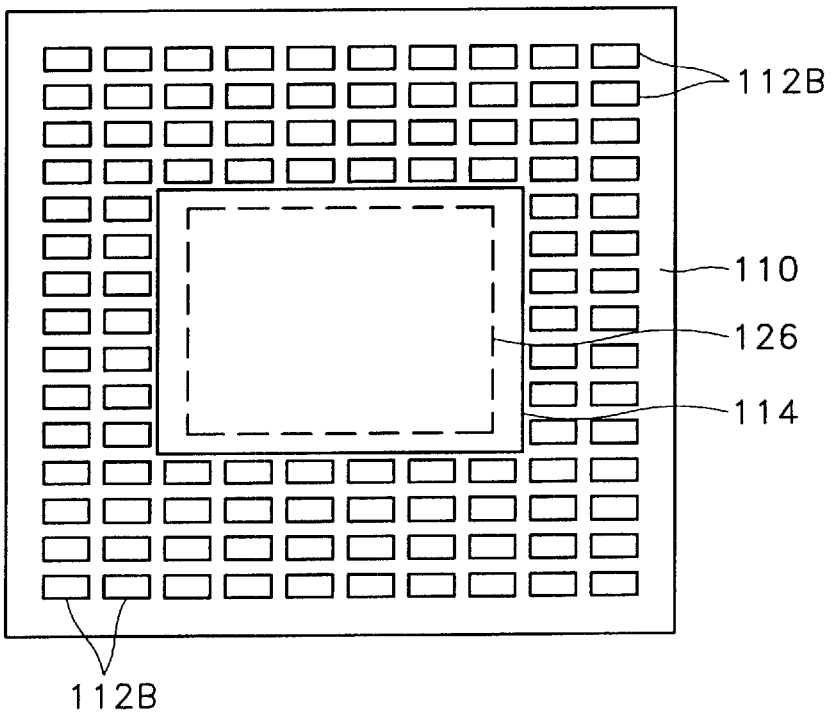

FIGS. 6 and 7 are plan views of tapes having implantable conductive lands having a modified shape according to the present invention. Unlike FIGS. 4 and 5 showing circular implantable conductive lands for connection of external connecting terminals, FIGS. 6 and 7 show rectangular implantable conductive lands 112B for connection of external connecting terminals. The shapes of the implantable conductive lands 112B can be modified into any shape as long as wire bonding and attachment of external connecting terminals can be performed normally. Although a tape having implantable conductive lands for assembling a single semiconductor package is illustrated in each of FIGS. 4 through 7, a strip having a plurality of tapes in rows and columns is used during actual manufacturing processes for facilitating the assembly of a plurality of semiconductor packages. It is apparent that the shape of such a strip can be modified to be suitable for the equipment used in a semiconductor package manufacturing company.

Figure 8:
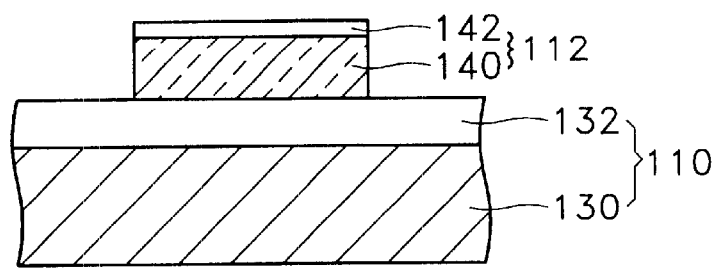
FIG. 8 is a partial sectional view of a tape having implantable conductive lands according to the present invention.

FIG. 8 is a partial sectional view of a tape having implantable conductive lands according to the present invention. Referring to FIG. 8, a tape according to the present invention includes a tape film 110 and implantable conductive lands 112 and/or 114. The tape film includes a tape body 130 and an adhesive layer 132.

The tape body 130 may be formed of any material which is not easily deformed by heat, and does not easily chemically react, and thus is not transformed and serves as a conventional lead frame or rigid substrate until an encapsulation process is completed during the assembly of semiconductor packages. Accordingly, a single material such as paper, polymer, a metal or a compound including one of them may be used. A representative material for the tape body 130 is a polyimide film among the polymers. The polyimide film maintains its electrical and mechanical characteristics in a temperature range of −296° C. to 400° C. and also has an excellent chemical resistivity. However, any material which is not transformed during the assembly of semiconductor packages can be substituted for the polyimide film.

Since the adhesive layer 132 should be easily detached from a semiconductor package encapsulated with an epoxy mold compound after an encapsulation process, it may be formed of any material which is not easily transformed during the assembly of the semiconductor package and is easily detached, rather than a material having an excellent adhesive strength. Various materials can be used for the adhesive layer 132, but a representative is a silicone-based adhesive.

In the implantable conductive land 112, a surface treatment layer 142 is formed on a second surface of a conductive land body 140 opposite to a first surface adhering to the tape film 110. The surface treatment layer 142 is provided for allowing wire bonding on the conductive land body 140. Accordingly, the surface treatment layer 142 may be formed of gold, silver, palladium or a compound including at least one of these metals. If the wire bonding is possible without the surface treatment layer 142, the surface treatment layer 142 may not be formed. Here, the conductive land body 140 is formed of copper or an alloy including copper.

Method of Manufacturing a Tape Having Implantable Conductive Lands for a Semiconductor Packaging Process according to the Present Invention FIGS. 9 through 13 are flowcharts illustrating a method of manufacturing a tape having implantable conductive lands for a semiconductor packaging process according to the present invention.

First Embodiment

Figure 9:
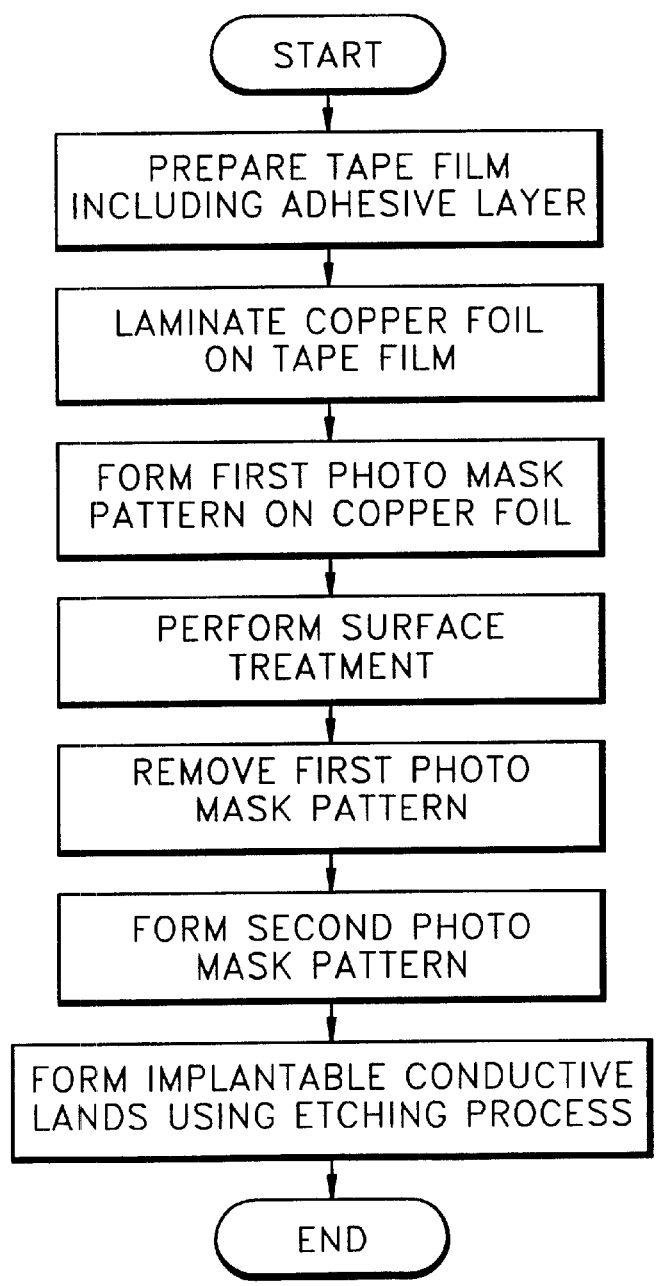
FIGS. 9 through 13 are flowcharts illustrating the method of manufacturing a tape having implantable conductive lands for a semiconductor packaging process according to the present invention.

FIG. 9 is a flowchart illustrating a method of manufacturing a tape having implantable conductive lands for a semiconductor packaging process according to a first embodiment of the present invention. Referring to FIG. 9, a tape film including an adhesive layer which can be easily detached from a semiconductor package that is encapsulated with an epoxy mold compound in an encapsulation process is prepared. Next, a copper foil used as an implantable conductive land body is laminated on the tape film. A first photo mask pattern exposing areas for implantable conductive lands is formed on the copper foil. A surface treatment is performed on the exposed areas to form surface treatment layers allowing wire bonding. Subsequently, the first photo mask pattern is removed. Next, a second photo mask pattern exposing the remaining portion other than the areas for implantable conductive lands is formed on the copper foil. An etching process is performed using the second photo mask pattern as an etching mask, thereby forming implantable conductive lands.

Second Embodiment

Figure 10:
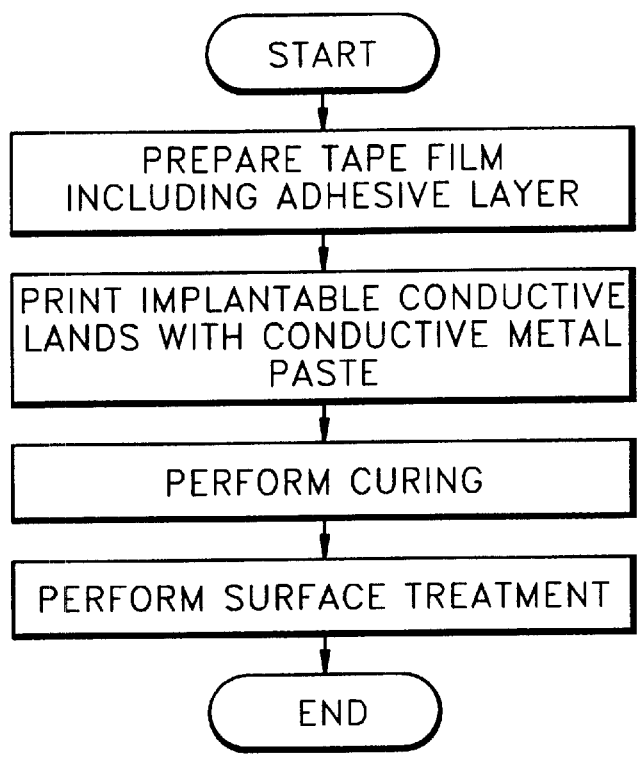

FIG. 10 is a flowchart illustrating a method of manufacturing a tape having implantable conductive lands for a semiconductor packaging process according to a second embodiment of the present invention. Referring to FIG. 10, a tape film including an adhesive layer which can be easily detached from a semiconductor package that is encapsulated with an epoxy mold compound in an encapsulation process is prepared. Next, implantable conductive lands are printed on the tape film with conductive metal paste. A volatile solvent contained in the conductive metal paste is removed by a curing process. Finally, a surface treatment for wire bonding is performed on the printed implantable conductive land.

Third Embodiment

Figure 11:
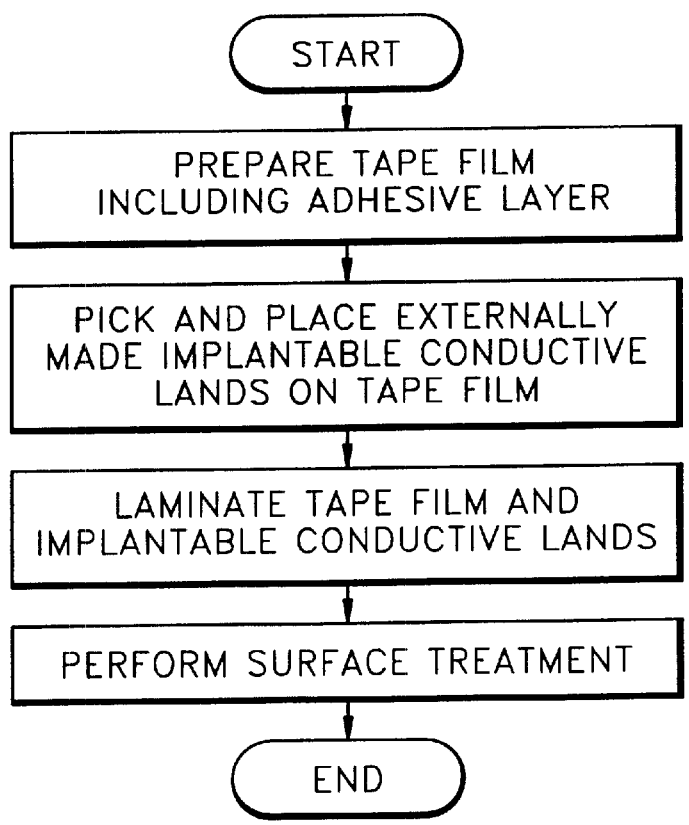

FIG. 11 is a flowchart illustrating a method of manufacturing a tape having implantable conductive lands for a semiconductor packaging process according to a third embodiment of the present invention. Referring to FIG. 11, a tape film including an adhesive layer which can be easily detached from a semiconductor package that is encapsulated with an epoxy mold compound in an encapsulation process is prepared. Unlike the other embodiments, implantable conductive lands are not formed on the tape film but are formed outside. For example, individual implantable conductive lands are prepared in advance by performing stamping in a press. The implantable conductive lands are then placed on the tape film using a pick and place machine. After completely placing all implantable conductive lands, the tape film and the implantable conductive lands are laminated. After completing the lamination, surface treatment is performed on the second surfaces of the implantable conductive lands. If the second surfaces of the implantable conductive lands have been surface-treated outside, the surface treatment can be eliminated.

Fourth Embodiment

Figure 12:
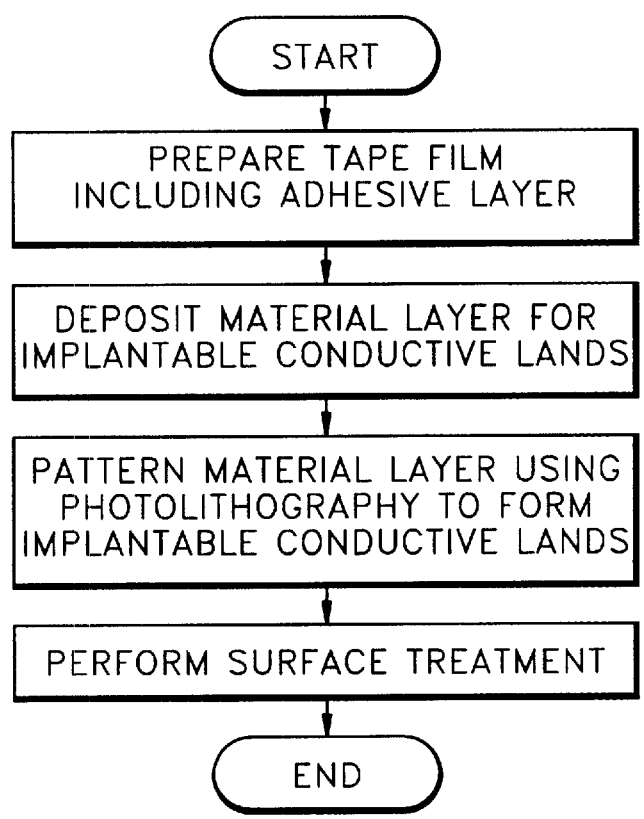

FIG. 12 is a flowchart illustrating a method of manufacturing a tape having implantable conductive lands for a semiconductor packaging process according to a fourth embodiment of the present invention. Referring to FIG. 12, a tape film including an adhesive layer which can be easily detached from a semiconductor package that is encapsulated with an epoxy mold compound in an encapsulation process is prepared. A thin film used as an implantable conductive land body is deposited on the tape film using a chemical vapor deposition (CVD) method or a physical vapor deposition (PVD) method, which are used when a general semiconductor chip is manufactured, and is then patterned by photolithography. Here, the method of depositing and patterning the thin film can be modified in various ways. Finally, surface treatment is performed on the implantable conductive lands.

Fifth Embodiment

Figure 13:
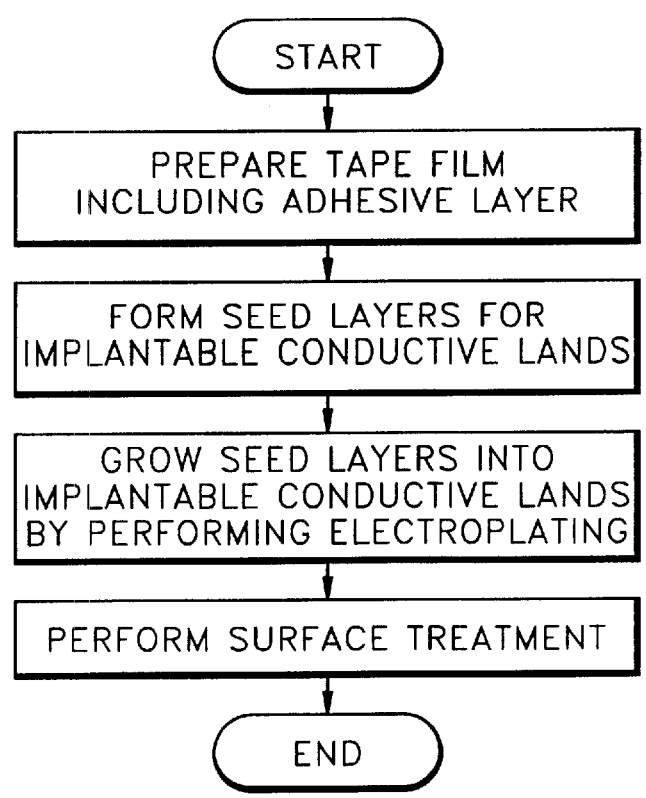

FIG. 13 is a flowchart illustrating a method of manufacturing a tape having implantable conductive lands for a semiconductor packaging process according to a fifth embodiment of the present invention. Referring to FIG. 13, a tape film including an adhesive layer which can be easily detached from a semiconductor package that is encapsulated with an epoxy mold compound in an encapsulation process is prepared. Next, seed layers for implantable conductive lands are formed on the tape film using photolithography, generally used when a semiconductor chip is manufactured.

Subsequently, an electroplating process is performed on the tape film having the seed layers so that the seed layers grow into implantable conductive lands. Finally, surface treatment for wire bonding is performed on the implantable conductive lands.

Structure of a Tape Having Implantable Conductive Lands in a Strip

Figure 14:
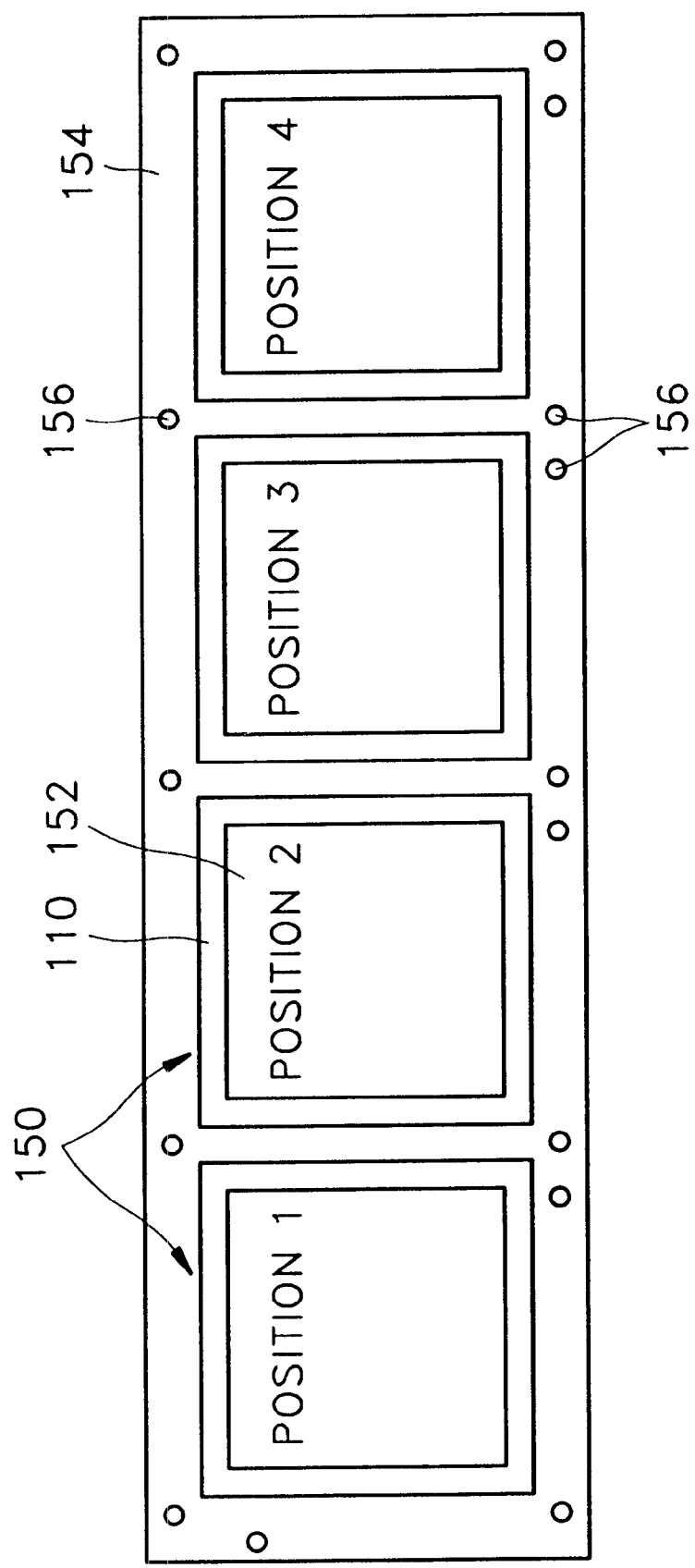
FIGS. 14 through 16 are plan views illustrating the structure of a tape having implantable conductive lands in a strip.
Figure 15:
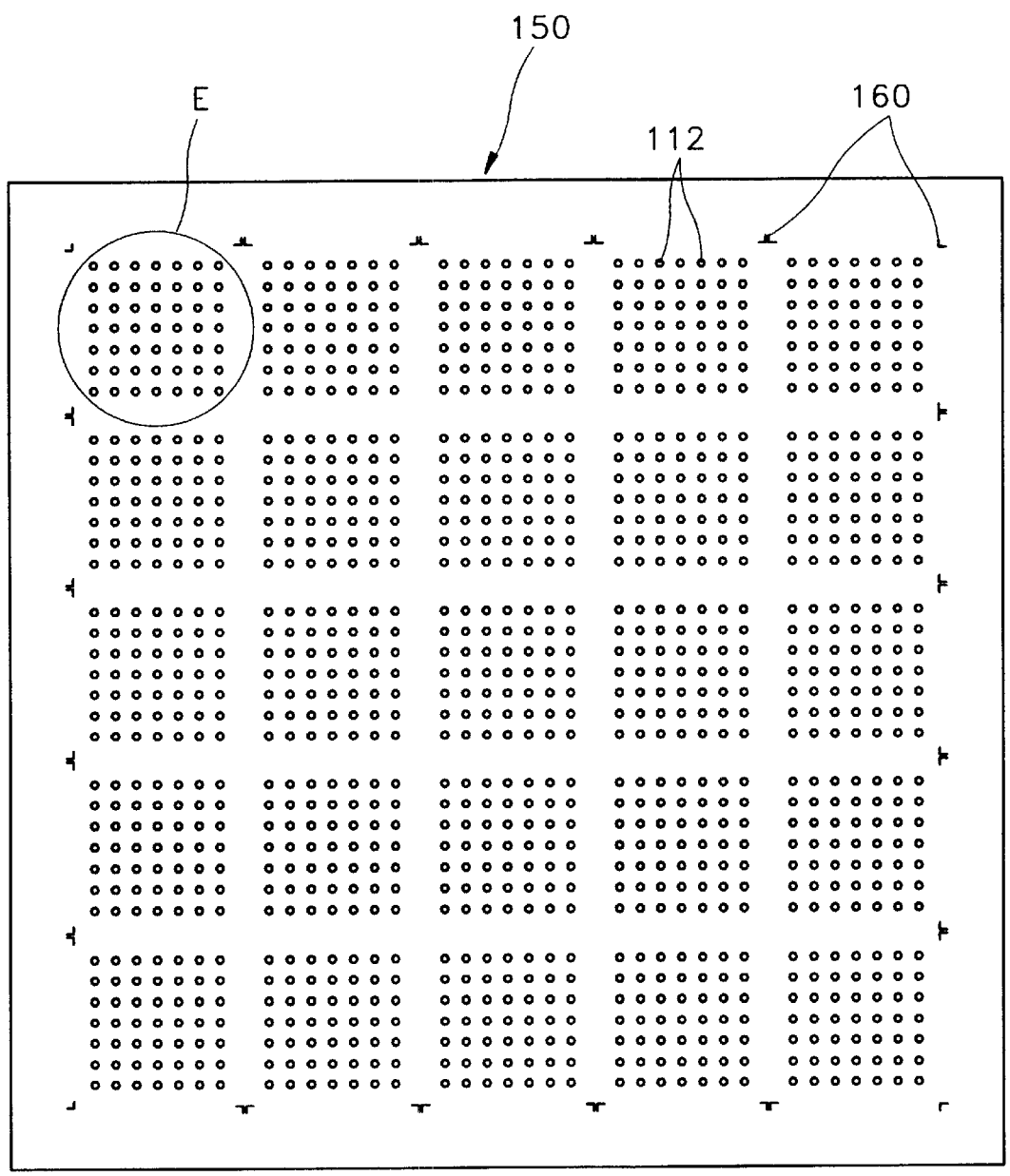
Figure 16:
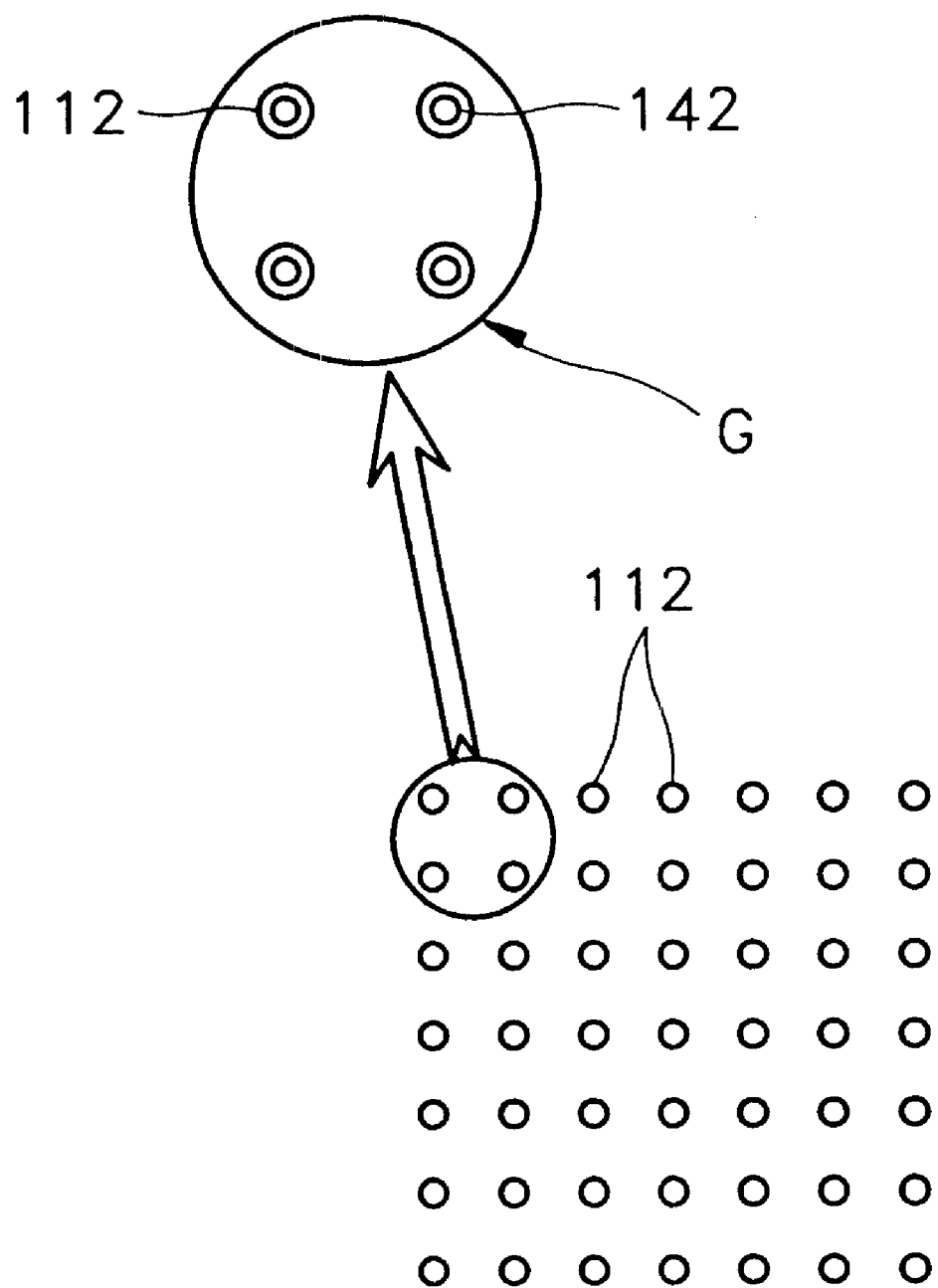

FIGS. 14 through 16 are plan views illustrating the structure of a tape having implantable conductive lands in a strip. A tape having implantable conductive lands is formed in a strip when semiconductor packages are actually assembled. Various types of strips can be formed according to a manufacturer's equipment. One embodiment will be described with reference to FIGS. 14 through 16.

FIG. 14 is a schematic plan view illustrating a strip of tapes having implantable conductive lands according to an embodiment of the present invention. Referring to FIG. 14, four tape strips 150 having implantable conductive lands according to the present invention are provided on a carrier 154 used as a means for conveyance during the manufacture of chip scale packages (CSP). The carrier 154 is formed of metal or plastic polymer. Reference numeral 110 denotes a tape film, reference numeral 152 denotes an area where implantable conductive lands are formed, and reference numeral 156 denotes holes used for moving the carrier 154.

FIG. 15 is a plan view illustrating one of the four tape strips 150 shown in FIG. 14. Referring to FIG. 15, implantable conductive lands 112 are formed on the tape strip 150 such that 25 semiconductor package units of five in a row and five in a column can be formed. Reference numeral 160 denotes positions through which a cutting saw blade passes in a singulation process.

FIG. 16 is an enlarged plan view of the portion E of FIG. 15. Referring to FIG. 16, implantable conductive lands 112 for a single semiconductor package are shown, and the shape of each implantable conductive land 112 can be modified in various ways. As shown in circle G illustrating four enlarged implantable conductive lands, a surface treatment layer 142 is not formed on the entire surface of each implantable conductive land 112 but may be formed only on as much area as is necessary to allow wire bonding.

Therefore, the present invention employing a tape having implantable conductive lands instead of a rigid substrate can achieve the following effects.

First, the present invention does not require intermediate connectors such as via-holes and circuit patterns within a semiconductor package, thereby improving the electrical performance of the semiconductor package.

Second, a tape having implantable conductive lands according to the present invention does not remain within a semiconductor package after assembling processes, thereby reducing the thickness of the semiconductor package.

Third, the present invention does not use a conventionally used expensive rigid substrate, thereby reducing the cost of the manufacture of a semiconductor package.

Fourth, the present invention does not require a process of forming via-holes or a solder mask, thereby simplifying the manufacture of a tape.

Fifth, the path of heat radiating out from the semiconductor chip is shortened by using implantable conductive lands for a heat sink, thereby improving the heat radiating ability of a semiconductor package.

Sixth, conventionally, differences between thermal expansive coefficients of a rigid substrate and other peripheral parts included within a semiconductor package cause a large amount of stress in the semiconductor package. However, the present invention does not include a rigid substrate, thereby solving the above problem.

Seventh, in a conventional singulation process, process defects such as cracks or liftings are formed during sawing for dividing a strip into individual semiconductor packages when a rigid substrate is multi-layered. However, in the present invention using a tape having implantable conductive lands, the process defects described above can be prevented, and sawing can be easily performed, because only an epoxy molding exists in an area which is sawed. Accordingly, the manufacturing yield of semiconductor packages can be improved. In addition, the rate of consumption of a saw blade used in the singulation process can be reduced.

Eighth, a sawing process or a singulation process can be eliminated depending on the structure of a mold.

Although the invention has been described with reference to particular embodiments, it will be apparent to one of ordinary skill in the art that modifications of the described embodiments may be made without departing from the spirit and scope of the invention.

What is claimed is:

1. A method for manufacturing a tape having implantable conductive lands for a semiconductor packaging process, the method comprising the steps of:

preparing a tape film serving as a lead frame or a substrate until an encapsulation process is completed, the tape film not being contained within a semiconductor package; and forming the implantable conductive lands on the tape film;

wherein the step of forming the implantable conductive lands comprises the sub-steps of:

printing the implantable conductive lands on the tape film; and performing surface treatment for wire bonding on the printed implantable conductive lands.

2. The method of claim 1, wherein the tape film comprises a tape body and an adhesive layer which can be easily detached from a material adhering thereto.

3. The method of claim 2, wherein the adhesive layer is formed of silicone resin-based paste.

4. A method for manufacturing a tape having implantable conductive lands for a semiconductor packaging process, the method comprising the steps of:

preparing a tape film serving as a lead frame or a substrate until an encapsulation process is completed, the tape film not being contained within a semiconductor package; and forming the implantable conductive lands on the tape film;

wherein the step of forming the implantable conductive lands comprises the sub-steps of:

laminating a copper foil on the tape film;

forming a first photo mask pattern on the copper foil;

performing surface treatment for wire bonding on opening areas of the first photo mask pattern;

removing the first photo mask pattern and forming a second photo mask pattern; and performing an etching process using the second photo mask pattern so that only the implantable conductive lands can remain on the tape film.

5. The method of claim 1, wherein the implantable conductive lands are printed with conductive metal paste.

6. A method for manufacturing a tape having implantable conductive lands for a semiconductor packaging process, the method comprising the steps of:

preparing a tape film serving as a lead frame or a substrate until an encapsulation process is completed, the tape film not being contained within a semiconductor package; and forming the implantable conductive lands on the tape film;

wherein the step of forming the implantable conductive lands comprises the sub-steps of:

picking and placing the implantable conductive lands that are made in the outside on the tape film in advance; and laminating the tape film and the implantable conductive lands.

7. The method of claim 6, further comprising the step of performing surface treatment for wire bonding on the surfaces of the implantable conductive lands after laminating the implantable conductive lands and the tape film.

8. A method for manufacturing a tape having implantable conductive lands for a semiconductor packaging process, the method comprising the steps of:

preparing a tape film serving as a lead frame or a substrate until an encapsulation process is completed, the tape film not being contained within a semiconductor package; and forming the implantable conductive lands on the tape film;

wherein the step of forming the implantable conductive lands is performed by depositing and patterning a material layer for the implantable conductive lands on the tape film.

9. The method of claim 8, wherein the deposition is performed by a chemical vapor deposition (CVD) method or a physical vapor deposition (PVD) method.

10. The method of claim 8, further comprising the step of performing surface treatment for wire bonding on the surfaces of the implantable conductive lands after forming the implantable conductive lands.

11. A method for manufacturing a tape having implantable conductive lands for a semiconductor packaging process, the method comprising the steps of:

preparing a tape film serving as a lead frame or a substrate until an encapsulation process is completed, the tape film not being contained within a semiconductor package; and forming the implantable conductive lands on the tape film;

wherein the step of forming the implantable conductive lands comprises the sub-steps of:

forming seed layers for the implantable conductive lands on the tape film; and performing electroplating using the seed layers.

* * * * *